March 12, 1968 G. HILLMAN ET AL 3,373,322

SEMICONDUCTOR ENVELOPE

Filed Jan. 13, 1966

INVENTORS

Gary Hillman

Allan Davis

BY Jack Schuman

ATTORNEY

United States Patent Office 3,373,322
Patented Mar. 12, 1968

3,373,322
SEMICONDUCTOR ENVELOPE
Gary Hillman, Livingston, and Allan Davis, Hazlet, N.J., assignors to Mitronics Inc., Murray Hill, N.J.
Filed Jan. 13, 1966, Ser. No. 520,386
4 Claims. (Cl. 317—234)

ABSTRACT OF THE DISCLOSURE

Semiconductor envelope comprises base, and ceramic header having spaced, flat metallized bosses with a perforation extending through each boss. Flanged nipples are brazed to the bosses. Prongs mounted to the base and electrically connected to various portions of the encapsulated semiconductor extend through the perforations into nipples and are crimped therein. Flanged collar on ceramic header is secured to base to complete envelope. Alternatively, nipples extend into perforations, and are brazed to the flat metallized bosses at the tops thereof.

This invention relates generally to a hermetically sealed semiconductor package or envelope. More specifically, this invention relates to an improved cap or header for such semiconductor envelope.

Semiconductor devices such as transistors, diodes, etc. are customarily enclosed in a sealed, gas-tight metallic envelope to cause thereby their electrical characteristics to vary but little over prolonged periods of time. There are many problems encountered in the design and manufacture of these envelopes. Non-metallic parts must be metallized in certain cases prior to attachment of metallic parts. Separate conductor elements must adequately be isolated from each other. Resistances must be kept low where the devices are used at higher frequencies. Overall manufacturing costs must be kept low, consistent with reliability of performance of the devices.

One of the objects of this invention is to provide an improved hermetically sealed semiconductor package or envelope.

Another of the objects of this invention is to provide an improved cap or header for a hermetically sealed semiconductor package or envelope.

Yet another object of this invention is to provide an improved cap or header for devices of the type herein described, wherein manufacturing costs are reduced in comparison with manufacturing costs of conventional packages or envelopes, and reliability of performance is increased.

Other and further objects of this invention will become apparent during the course of the following description and by reference to the accompanying drawing and the appended claims.

Referring now to the drawing in which like numerals represent like parts in the several views.

Figures 1, 2, 3, 4, 5, 6, 7:
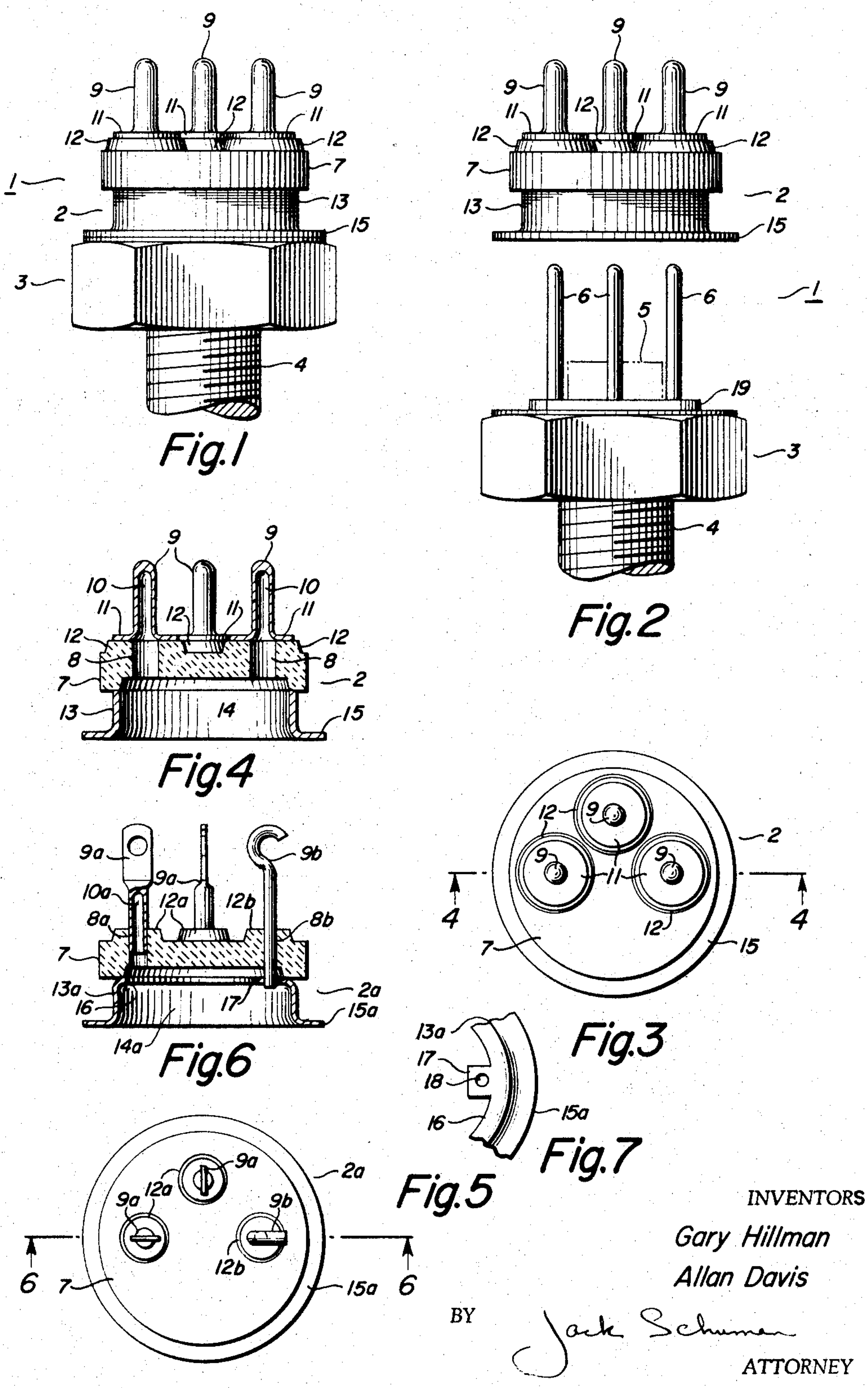
FIGURE 1 represents a view in elevation of an assembled semiconductor package or envelope showing only so much of the stud as is necessary for an understanding of the present invention.
FIGURE 2 represents a partially exploded view in elevation of the semiconductor package or envelope of FIGURE 1, showing in phantom the semiconductor diagrammatically in a general sense only.
FIGURE 3 represents a view in plan of the improved cap or header.
FIGURE 4 represents a section in elevation of the improved cap or header, taken along the line 4—4 of FIGURE 3.
FIGURE 5 represents a view in plan of a modified cap or header.
FIGURE 6 represents a section in elevation of the modified cap or header, taken along the line 6—6 of FIGURE 5.
FIGURE 7 represents a view looking downwardly at the right side of the metallic collar of FIGURE 6, underneath the insulating disc, showing the tab grounding a lead to the said metallic collar.

Semiconductor package or envelope 1 is seen as comprising cap 2 and a base 3 provided with stud 4 to facilitate heat sinking and mounting of the said package or envelope 1. The semiconductor 5 is indicated diagrammatically only by phantom lines in FIGURE 2 and, in the disclosed embodiment, has three points of electrical connection to prongs 6, the latter being secured to electrically insulating disc 19 which, in turn, is secured to base 3.

Cap 2 is seen as comprising an electrically insulating disc 7 which may, for example, be made from a 95% $Al_2O_3$ material, which disc 7 is provided with perforations 8 adapted to register with prongs 6 as will hereinafter be described. Electrically conductive leads or nipples 9 are mounted on the outside face of disc 7 (i.e., that face of disc 7 remote from base 3), each registering with one of the perforations 8 and hence with one of the prongs 6. Each lead or nipple 9 is formed with a longitudinal recess 10 therein adapted to receive a prong 6. Each lead or nipple 9 has an enlarged base 11 thereon by means of which the lead or nipple 9 is secured to bosses 12 on disc 7 as will hereinafter be described.

The inside face of disc 7 (i.e., that face of disc 7 proximate base 3) is provided with metallic collar 13 which may be secured to the said disc 7 in a manner to be described. Collar 13 provides a chamber 14 for semiconductor 5 and is formed with flange 15 adapted to mate with base 3 and to be secured thereto gas-tightly in assembling the package or envelope 1.

The manufacture and assembly of cap 2 will now be described. The tops of bosses 12 are flat and can be metallized by conventional techniques, employing only a simple roller for such metallizing operation. This is to be distinguished from those expensive and time consuming operations required to metallize concave or convex surfaces or the inside of holes, as encountered in the manufacture of conventional semiconductor packages or envelopes. Leads or nipples 9 are then brazed in position, also by means of conventional techniques, in registry, of course, with perforations 8. Similarly, the periphery of the inside face of disc 7 is flat and may also be metallized by conventional techniques, employing only a simple roller for such metallizing operation. Collar 13 is then brazed in position, also by means of conventional techniques. Cap 2 has now been assembled.

The assembly of the package or envelope 1 will now be described. Semiconductor 5 is electrically secured to prongs 6. Base 3 and cap 2 are then brought together so that prongs 6 extend through perforations 8 of disc 7 and into leads or nipples 9, and flange 15 abuts base 3. Flange 15 may then be gas-tightly secured to base 3 by suitable means, such as cold-welding, and leads or nipples 9 may then be crimped or otherwise deformed so that prongs 6 therein are securely maintained in electrical contact therewith. The crimps in leads or nipples 9 have been omitted from the drawings in order to simplify the same.

In that embodiment of the invention shown in FIGURES 5–6, employing cap 2*a*, it will be seen that metallic collar 13*a* has flange 15*a* at one end thereof adapted to mate with and be gas-tightly secured to base 3 as by cold welding. The other end of collar 13*a* is provided with an inwardly extending flange 16 brazed to the inside face of disc 7 by means of conventional techniques. Collar 13*a* provides a chamber 14*a* for the semiconductor 5. Electrically conductive leads or nipples *9a*, shown in this embodiment as flattened and pierced (although this particular configuration is for illustrative purposes only) extend through perforations *8a* of disc 7 and are secured thereto by suitable means such as brazing (not shown) at the tops of bosses 12*a*. Leads or nipples *9a* are provided with longitudinal recesses 10*a* adapted to receive prongs 6.

FIGURE 6 also shows an arrangement for grounding a lead to the collar 13*a*, which may be desirable for certain applications, it being understood that an appropriate portion of semiconductor 5 will then be in electrical contact with the said collar 13*a* and hence with the said lead. Thus, collar 13*a* is provided with inwardly extending tab 17 (shown more clearly in FIGURE 7) having a perforation 18 therethrough. Lead or nipple *9b* which is to be grounded to collar 13*a* and is shown as hooked (which particular configuration is for illustrative purposes only) extends through perforation *8b* in disc 7 and through perforation 18 in tab 17 and is then secured as by brazing (not shown) to the top of boss 12*b* and to the underside of tab 17. In the preferred embodiment, lead or nipple *9b* is solid.

The assembly of package or envelope 1 employing cap 2*a* with a base 3 is the same as previously described in connection with FIGURES 1–4, prongs 6 extending into recesses 10*a* of leads or nipples *9a*, the said leads or nipples *9a* subsequently being crimped or otherwise deformed to secure the prongs 6 in electrical contact therewith. Obviously, for the particular embodiment shown in FIGURES 5–6, having two leads or nipples *9a* with recesses 10*a* therein, base 3 will have only two prongs 6.

It will be understood that the embodiment of FIGURES 5–6 may, if desired, not incorporate a grounded lead or nipple *9b* and, while only two leads or nipples *9a* are shown therein, the illustrated embodiment is not limited to such number of leads or nipples *9a*.

It will also be understood that the arrangement of grounding a lead or nipple *9b* to collar 13*a* by means of tab 17 as shown in FIGURES 6 and 7 may, if desired, be employed with the embodiment of FIGURES 1–4 and the illustrated embodiment of these figures is not limited to the particular number of leads or nipples 9 shown therein.

We have provided a package or envelope for semiconductors which is economical to manufacture and rugged and reliable in service. Metallizing is applied only to flat areas by simple roller means, eliminating conventional grinding and lapping operations. Moreover, the present design permits adequate isolation or creepage distances between conductors by proper proportioning of the insulating disc. The leads or nipples lend themselves to fabrication from oxygen-free high conductivity copper for low resistance and hence more efficient operation at higher frequencies, it being understood, however, that these elements can, if desired, be made from other suitable materials such as nickel, etc.

While we have shown the best embodiments of our invention now known to us, we do not wish to be limited to the exact structures herein shown and described, but may include such modifications, substitutions and equivalents as are embraced within the scope of the specification and drawing or as pointed out in the claims.

We claim:

1. An envelope enclosing a semiconductor, said envelope comprising:
   (a) a base having a face adapted to support a semiconductor,
   (b) a plurality of spaced parallel electrically conductive prongs mounted to said face of said base, each prong being electrically connected to a region of said semiconductor,
   (c) an electrically insulating disc having a first face and a second face,
   (d) a plurality of spaced, flat-topped bosses integrally formed on said disc, said bosses extending from the first face of said disc, there being one boss for each of the plurality of prongs, the flat tops of said bosses being metallized,
   (e) said disc having a plurality of perforations therethrough, there being one perforation for each of the plurality of prongs, each perforation extending from the top of one boss centrally through said boss to the second face of said disc,
   (f) a plurality of electrically conductive leads mounted to said disc, there being one of said leads for each of the plurality of prongs, each lead being brazed to the metallized flat top of one of said bosses,
   (g) each lead having a longitudinal recess therein aligned with the perforation of its respective boss and receiving one of said prongs, each lead being deformed to secure said prong therein,
   (h) a metallic collar interposed between and secured to the second face of said disc and the said face of said base, said collar circumscribing said prongs and providing a chamber for said semiconductor.
2. An envelope as in claim 1, further comprising:
   (i) each of said leads having a flat flange formed thereon, said flanges being brazed to the metallized flat tops of said bosses.
3. An envelope as in claim 1, further comprising:
   (i) a flat metallized surface circumscribing the second face of said disc,
   (j) said metallic collar being brazed to said flat metallized surface.
4. An envelope as in claim 1, further comprising:
   (i) an annular flat-topped boss integrally formed on said disc and extending from the second face of said disc, said annular flat-topped boss circumscribing the second face of said disc, the flat top of said annular boss being metallized,
   (j) said metallic collar being brazed to said annular flat-topped metallized boss.

References Cited

UNITED STATES PATENTS 3,268,309 8/1966 Frank et al.

FOREIGN PATENTS 400,016 11/1942 France.

DARRELL L. CLAY, *Primary Examiner.*